(12) United States Patent
Chiu et al.

(10) Patent No.: US 9,494,831 B2
(45) Date of Patent: Nov. 15, 2016

(54) DISPLAY PANEL WITH CONDUCTIVE LAYER HAVING VARYING LINE WIDTHS

(71) Applicant: Innolux Corporation, Miao-Li County (TW)

(72) Inventors: Shun-Fu Chiu, Miao-Li County (TW); Ming-Chang Lin, Miao-Li County (TW); Ying-Tong Lin, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 38 days.

(21) Appl. No.: 14/307,522

(22) Filed: Jun. 18, 2014

(65) Prior Publication Data

US 2015/0293412 A1 Oct. 15, 2015

(30) Foreign Application Priority Data

Apr. 9, 2014 (TW) .............. 103112945 A

(51) Int. Cl.
*H01L 27/12* (2006.01)
*G02F 1/1343* (2006.01)
*G02F 1/1362* (2006.01)
*G02F 1/1333* (2006.01)

(52) U.S. Cl.
CPC ....... *G02F 1/134309* (2013.01); *G02F 1/1362* (2013.01); *G02F 1/13439* (2013.01); *G02F 1/133345* (2013.01); *G02F 1/136286* (2013.01); *H01L 27/1214* (2013.01)

(58) Field of Classification Search
None
See application file for complete search history.

(56) References Cited

U.S. PATENT DOCUMENTS

2010/0053058 A1 3/2010 Nagashima et al.
2013/0140715 A1 6/2013 Jeng et al.

FOREIGN PATENT DOCUMENTS

JP 2008130967 A 6/2008

OTHER PUBLICATIONS

EPO Search Report dated Nov. 18, 2014.
KIPO Office Action dated Nov. 19, 2015 in corresponding application (No. 10-2014-0188720).

*Primary Examiner* — Fernando L Toledo
*Assistant Examiner* — Valerie N Newton
(74) *Attorney, Agent, or Firm* — McClure, Qualey & Rodack, LLP

(57) ABSTRACT

A display panel comprises a first substrate, a second substrate opposite to the first substrate, and a display medium layer disposed between the first and second substrates. The first substrate comprises a conductive layer formed on the first base plate and extending along a first direction. Along the first direction, the conductive layer comprises a first plane correspondingly at a first height, a tilted plane, and a second plane correspondingly at a second height in sequential order. The first height is greater than the second height. A position of the first plane adjacent to the tilted plane of the conductive layer has a first line width along the second direction. A position of the tilted plane adjacent to the second plane of the conductive layer has a second line width along the second direction. The first line width is shorter than the second line width.

18 Claims, 4 Drawing Sheets

DISPLAY PANEL WITH CONDUCTIVE LAYER HAVING VARYING LINE WIDTHS

This application claims the benefit of Taiwan application Serial No. 103112945, filed Apr. 9, 2014, the subject matter of which is incorporated herein by reference.

BACKGROUND

1. Field of the Invention

The disclosure relates in general to a display panel, and more particularly to a display panel with conductive layer having varying line widths.

2. Description of the Related Art

Today, electronic products with displays, such as smart phones, tablet personal computers (i.e. tablet PC, flat PC, ex: iPad), laptops, monitors, and televisions, are necessary tools for work and leisure in the daily life. Liquid crystal display (LCD) is the most popular displays in use. Being compact in size, light in weight, power-saving and radiation-free, LCDs are the most popular displays in use. LCD is a flat panel display, electronic visual display, or video display that uses the light modulating properties of liquid crystals. LCD possesses the excellent characteristics such as compact in size, light weight, easy to carry, having reasonable price, higher display quality and operation reliability. Also, viewer's eyes feel much more comfortable looking at a LCD. Older cathode ray tube (CRT) monitors are being replaced by LCD. Currently, LCDs provide a versatile choice in sizes, shapes and resolutions for the consumer.

The important factors for manufacturing a qualified display panel includes not only the details in procedures such as accurate patterning steps (ex: lithography and etch) without breaking conductive traces, but also the electrical performances such as the resistance, capacitance meeting the requirements of the product, thereby producing the display panel with good reliability. The faulty design of the display panel will lead to the decreases of the yield and reliability of production.

SUMMARY

The disclosure is directed to a display panel comprising a conductive layer having varying line widths, wherein the positions of the conductive layer at different heights have different line widths. According to the design of varying line widths of the embodiment, the conductive layer has sufficient line widths after patterning procedure, and would not be over-etched and broken easily. Also, the parasitic capacitance between the overlapping portions of the conductive layers can be efficiently controlled at a certain low value, thereby improving the yield and the electrical performance of the production.

According to one embodiment of the disclosure, a display panel is provided, comprising a first substrate, a second substrate and a display medium layer disposed between the first substrate and the second substrate. The first substrate comprises a conductive layer formed on a base plate and extending along a first direction. The conductive layer comprises a first plane correspondingly at a first height, a tilted plane, and a second plane correspondingly at a second height in a sequential order along the first direction, wherein the first height is greater than the second height. Also, a position of the first plane adjacent to the tilted plane of the conductive layer has a first line width along a second direction, and a position of the tilted plane adjacent to the second plane of the conductive layer has a second line width along the second direction. The first line width is shorter than the second line width.

According to one embodiment of the disclosure, a display panel is provided, comprising a first substrate, a second substrate disposed oppositely to the first substrate, and a display medium layer disposed between the first substrate and the second substrate. The first substrate comprises a base plate, a first conductive layer formed on the base plate and extending along a second direction, and a second conductive layer formed on the first conductive layer and extending along a first direction. The second conductive layer comprises a first portion overlapping the first conductive layer, a second portion non-overlapping the first conductive layer, and a boundary between the first portion and the second portion. The first portion at the boundary has a first line width along the second direction, and the second portion at the boundary has a second line width along the second direction, and the first line width is shorter than the second line width.

The above and other aspects of the disclosure will become better understood with regard to the following detailed description of the preferred but non-limiting embodiments. The following description is made with reference to the accompanying drawings.

DETAILED DESCRIPTION

Figure 1:
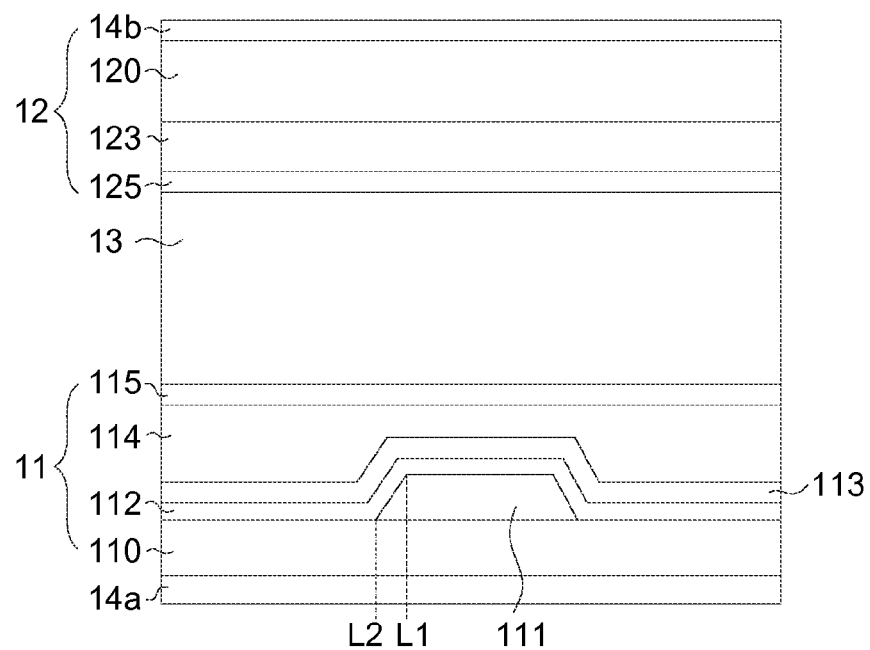
FIG. 1 is a cross-sectional view of a display panel.

In the embodiment of the present disclosure, a display panel is disclosed by varying line widths for the positions of a conductive layer at different heights (ex: the higher position at which an element is formed beneath and the lower position relative to the higher position) have different line widths. For example, it is designed that the second conductive layer at the overlapping position and the non-overlapping position between the second conductive layer and the first conductive layer under the second conductive layer has different line widths, respectively. According to the design of varying line widths of the embodiment, the conductive layer has sufficient line widths after patterning procedure, and would not be over-etched and broken easily. Also, the parasitic capacitance of the overlapping position between the upper and lower conductive layers can be efficiently controlled at a certain low value, thereby improving the yield and the electrical performance of the display panel manufactured by the embodiment.

The disclosure is directed to a display panel comprising a conductive layer having varying line widths, wherein the positions of the conductive layer at different heights have different line widths. According to the design of varying line widths of the embodiment, the conductive layer has sufficient line widths after patterning procedure, and would not be over-etched and broken easily. Also, the parasitic capacitance between the overlapping portions of the conductive layers can be efficiently controlled at a certain low value, thereby improving the yield and the electrical performance of the production.

The embodiments are described in details with reference to the accompanying drawings. It is noted that the details of the structures of the embodiments are provided for exemplification, and the described details of the embodiments are not intended to limit the present disclosure. The identical and/or similar elements of the embodiments are designated with the same and/or similar reference numerals. It is noted that not all embodiments of the invention are shown. Modifications and variations can be made without departing from the spirit of the disclosure to meet the requirements of the practical applications. Thus, there may be other embodiments of the present disclosure which are not specifically illustrated. Further, the accompany drawings are simplified for clear illustrations of the embodiment; sizes and proportions in the drawings are not directly proportional to actual products, and shall not be construed as limitations to the present disclosure. Thus, the specification and the drawings are to be regard as an illustrative sense rather than a restrictive sense.

FIG. 1 is a cross-sectional view of a display panel. Although the structure of FIG. 1 is depicted for exemplifying an embodiment, the details of this display panel are not provided for limiting the scope of protection of the disclosure. The display panel comprises a first substrate 11, a second substrate 12, and a display medium layer 13 disposed between the first substrate 11 and the second substrate 12. The first substrate 11 and the second substrate 12 could be a TFT substrate and a CF substrate, respectively.

As shown in FIG. 1, the first substrate 11 comprises a first base 110, a first conductive layer 111, a second conductive layer 113, an insulation layer 112 between the first conductive layer 111 and the second conductive layer 113, and a first transparent conductive layer 115. The first transparent conductive layer 115 can be an ITO layer, which is deposited and patterned to form the pixel electrodes. The conductive layer comprises a plurality of patterned conductive traces. The first substrate 11 further comprises a plurality of thin film transistors (TFTs, not shown in Figures) formed on the first base 110, and a first interlayer 114 positioned between the first base 110 and the first transparent conductive layer 115, wherein the first interlayer 114 covers the patterned conductive traces. The first substrate 11 further comprises a first alignment film (not shown), such as polyimide (PI), formed on the first transparent conductive layer 115. The typical layer construction of the first substrate 11 and the film disposition thereon are known to the people skilled in the art, so that it is not redundantly described herein.

As shown in FIG. 1, the second substrate 12 of an embodiment comprises a second base 120, a color filter photoresist layer 123 formed on the second base 120, and a second transparent conductive layer 125 formed on the color filter layer 123. The second substrate 12 further comprises a second alignment film (not shown) formed on the second transparent conductive layer 125, and a light-shielding patterned layer (not shown; for example, the black matrix BM) formed on the second base 120. The second transparent conductive layer 125 can be an ITO layer.

In one embodiment, the display panel further comprises a plurality of spacers for maintaining a uniform gap (i.e. cell gap) between the first substrate 11 and the second substrate 12, and liquid crystal material is filled in the gap to form the display medium layer 13. In other embodiment, the display medium layer 13 could be an organic light emitting layer. Furthermore, a first polarizer 14a and a second polarizer 14b are attached to the exterior sides of the first base 110 and the second base 120, respectively.

In the embodiment, it is designed that the same conductive layer, such as the second conductive layer 113 (ex: data lines) of the TFT substrate (the first substrate 11), has different line widths at different heights. For example, it can be designed that a top surface and a bottom surface of the second conductive layer 113 have different line widths, and a tilted surface of the second conductive layer 113 corresponding to the first conductive layer 111 also have varying line widths. Some related embodiments are provided below for illustrating different designs of line width variations as exemplification.

First Embodiment

Figure 2:
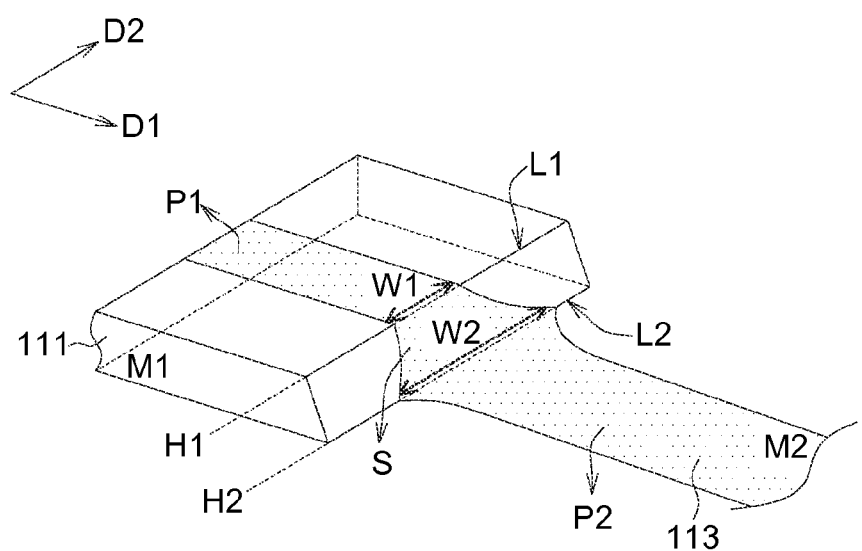
FIG. 2 illustrates a portion of the conductive layers of a display panel according to the first embodiment of the present disclosure.

FIG. 2 illustrates a portion of the conductive layers of a display panel according to the first embodiment of the present disclosure. Although the line width variation of the second conductive layer is taken for illustration herein, the disclosure is not limited to the second conductive layer as described below. It is noted that the design of the embodiment can be applied to other conductive layers without departing from the spirit of the disclosure. Additionally, the drawings of the embodiments mainly show the related characteristic parts for clearly illustrating the embodiment.

In one embodiment, a conductive layer formed on a base plate, such as the second conductive layer (M2)113 of the first substrate 11, extends along a first direction D1. Along the first direction D1, the second conductive layer 113 sequentially comprises a first plane P1 correspondingly at a first height H1, a tilted plane S, and a second plane P2 correspondingly at a second height H2. The first height H1 is greater than the second height H2. A position of the first plane P1 adjacent to the tilted plane S of the second conductive layer 113 has a first line width W1 along a second direction D2, and a position of the tilted plane S adjacent to the second plane P2 of the second conductive layer 113 has a second line width W2 along the second direction D2, wherein the first line width W1 is shorter than the second line width W2. In one embodiment, the second line width W2 of the second conductive layer 113 is positioned (or adjacent to) the boundary between the tilted plane S and the second plane P2, and can be the maximum line width of the second plane P2.

As shown in FIG. 2, the first conductive layer 111 extends along the second direction D2 which is substantially perpendicular to the first direction D1. The second conductive layer 113 extends across the top of the first conductive layer (M1) 111, and the first plane P1 of the second conductive layer 113 is corresponding to a top surface of the first conductive layer 111. The second plane P2 of the second conductive layer 113 and the first conductive layer 111 are not overlapped. The tilted plane S of the second conductive layer 113 is corresponding to a slanted surface adjoining the top and bottom surfaces of the first conductive layer 111.

Please refer to FIG. 1 and FIG. 2. Due to the formation of the slanted surface, the first conductive layer 111 has the first edge L1 at the boundary between the top surface and the slanted surface, and the second edge L2 at the boundary between the slanted surface and the bottom surface. The first edge L1 of the first conductive layer 111 is corresponding to (not exactly aligned with) the boundary between the first plane P1 and the tilted plane S of the second conductive layer 113. The second edge L2 of the first conductive layer 111 is corresponding to (not exactly aligned with) the boundary between the tilted plane S and the second plane P2 of the second conductive layer 113.

In one embodiment, the portion of the second conductive layer 113 having the second line width W2 is adjacent to the boundary between the tilted plane S and the second plane P2. Also, the tilted plane S of the second conductive layer 113 presents an arrangement of varying line widths, and the arrangement of varying line widths presents an increasing tendency of line widths correspondingly from the first plane P1 towards the second plane P2. As shown in FIG. 2, the tilted plane S of the second conductive layer 113 has a maximum line width at the boundary between the tilted plane S and the second plane P2. Although two curving sides of the tilted plane S of the second conductive layer 113 are depicted for exemplifying the variation of line widths, the disclosure has no particular limitation thereto. The tilted plane S of the second conductive layer 113 may present a linear increasing tendency of line widths, and the sides of the tilted plane S can be two straight lines.

Additionally, the second conductive layer 113 of FIG. 2 can be divided into three portions, including the first portion O1 (FIG. 3A) overlapping the first conductive layer 111 (i.e., including the first plane P1 and the tilted plane S), the second portion O2 non-overlapping the first conductive layer 111 (i.e., the second plane P2), and a boundary between the first portion O1 and the second portion O2. The first portion O1 has a first line width W1 along the second direction D2, while the second portion O2 at the boundary has a second line width W2 along the second direction D2, and the first line width W1 is shorter than the second line width W2.

Figure 3A:
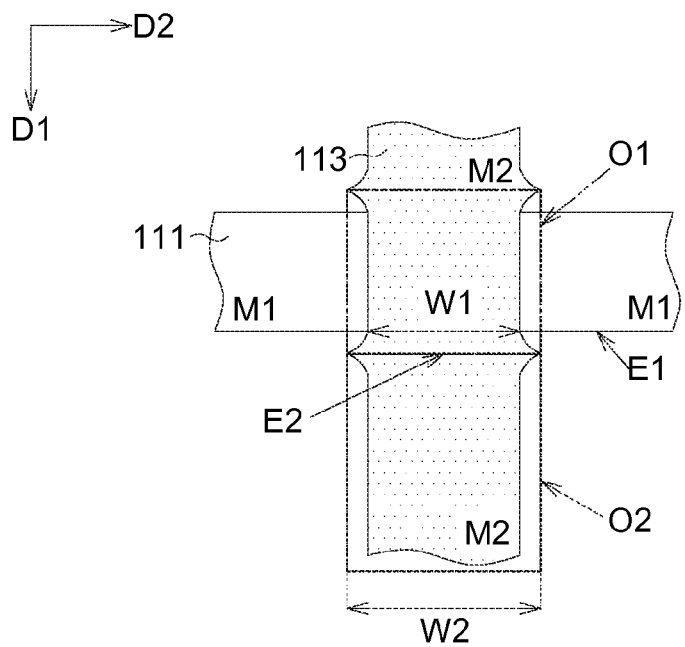
FIG. 3A is a top view of the first configuration of the conductive layers of the display panel according to the first embodiment of the present disclosure.
Figure 3B:
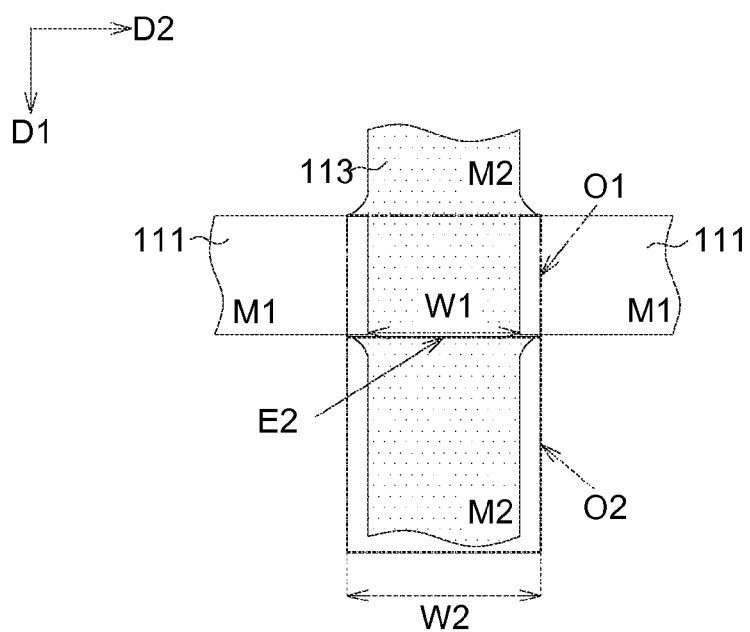
FIG. 3B is a top view of the second configuration of the conductive layers of the display panel according to the first embodiment of the present disclosure.

FIG. 3A is a top view of the first configuration of the conductive layers of the display panel according to the first embodiment of the present disclosure. FIG. 3B is a top view of the second configuration of the conductive layers of the display panel according to the first embodiment of the present disclosure. Please also refer to FIG. 1 and FIG. 2. The difference between the configurations of FIG. 3A and FIG. 3B is the slopes of the slanted surfaces of the first conductive layer 111.

If the slanted surface of the first conductive layer 111 has a gentle slope, a top-view drawing is able to show the first border E1 of the first conductive layer 111 along the second direction D2 and a boundary E2 of the second conductive layer 113, as shown in FIG. 3A (ex: the first border E1 corresponds to a position between the first plane P1 and a plane (such as the tilted plane S) connected to the first plane P1 of the second conductive layer 113). The boundary E2 of the second conductive layer 113, which adjoins the first portion O1 (overlapping the first conductive layer 111) and the second portion O2 (non-overlapping the first conductive layer 111) of the second conductive layer 113, is positioned outside (apart from) the first border E1 of the first conductive layer 111.

If the slanted surface of the first conductive layer 111 has a steep slope, the first border E1 of the first conductive layer 111 along the second direction D2 and the boundary E2 of the second conductive layer 113 almost overlap each other as the same line, as shown in FIG. 3B. Accordingly, in the case of the first conductive layer 111 sloped down sharply, the boundary E2 of the second conductive layer 113 is almost aligned with the first border E1 of the first conductive layer 111 in the top-view drawing.

In the manufacture of the conductive layers configured according to the embodiment, the photomask with openings shaped in accordance with the line width variation can be provided. A conductive film can be patterned through the photomask to form a conductive layer with varying line widths based on the design of the embodiment. It is known that the pattern of the photomask in practical application can be modified and changed depending on the to-be-formed configuration of the conductive layer.

According to the design of a conductive layer with varying line widths of the embodiment, the positions of the conductive layer at different heights (such as the portions of the second conductive layer overlapping and non-overlapping the first conductive layer correspondingly) have different line widths, so that the line width of the top surface of the conductive layer is shorter than that of the bottom surface of the conductive layer. According to one embodiment as described above, the line width (ex: the first line width W1) at the top of the tilted plane of the second conductive layer 113 (corresponding to the first edge L1 of the first conductive layer 111) is shorter than the line width (ex: the second line width W2) at the bottom of the tilted plane of the second conductive layer 113 (corresponding to the second edge L2 of the first conductive layer 111). According to the design of varying line widths of the embodiment, the conductive layer across other objects at different heights will have sufficient line widths after patterning procedure, and would not be over-etched and broken easily due to the accumulation of etching solution at low-lying positions. Also, the parasitic capacitance of the overlapping position between the upper and lower conductive layers can be efficiently controlled at a certain low value. If the overlapping area between the upper and lower conductive layers is too large, the parasitic capacitance will be too high. Therefore, the display panel manufactured according to the embodied design possesses complete profiles of the conductive layer and sufficient line widths, thereby increasing the yield of production and improving the electrical performance of the display panel.

Second Embodiment

Figure 4:
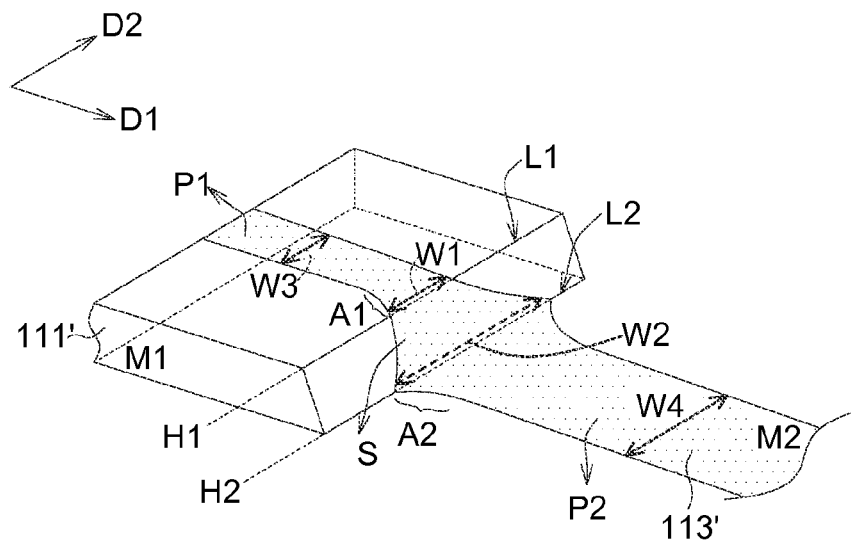
FIG. 4 illustrates a portion of the conductive layers of a display panel according to the second embodiment of the present disclosure.

FIG. 4 illustrates a portion of the conductive layers of a display panel according to the second embodiment of the present disclosure. Similar to the first embodiment, the line width variation of the second conductive layer 113' across the first conductive layer 111' is discussed below for illustrating the second embodiment. However, the disclosure is not limited thereto.

Please also refer to FIG. 1. In the second embodiment, a conductive layer formed on a base plate, such as the second conductive layer (M2)113' of the first substrate 11, extends along the first direction D1. The first conductive layer 111' extends along the second direction D2, and the second direction D2 is substantially perpendicular to the first direction D1. A first plane P1 of the second conductive layer 113' is corresponding to a top surface of the first conductive layer 111'. A second plane P2 of the second conductive layer 113' and the first conductive layer 111' are not overlapped. A tilted plane S of the second conductive layer 113' is corresponding to a slanted surface adjoining the top and bottom surfaces of the first conductive layer 111'.

Along the first direction D1, the second conductive layer 113' sequentially comprises the first plane P1 correspondingly at a first height H1, the tilted plane S, and the second plane P2 correspondingly at a second height H2. The first height H1 is greater than the second height H2. A position of the first plane P1 adjacent to the tilted plane S of the second conductive layer 113' has a first line width W1 along the second direction D2, and a position of the tilted plane S adjacent to the second plane P2 of the second conductive layer 113' has a second line width W2 along the second direction D2, wherein the first line width W1 is shorter than the second line width W2. Also, the tilted plane S of the second conductive layer 113' presents an arrangement of varying line widths, and the arrangement of varying line widths presents an increasing tendency of line widths correspondingly from the first plane P1 towards the second plane P2. As shown in FIG. 4, the tilted plane S of the second conductive layer 113' has a maximum line width at the boundary between the tilted plane S and the second plane P2.

Additionally, the first plane P1 of the second conductive layer 113' adjacent to the tilted plane S has a first region A1 with varying line widths. As shown in FIG. 4, the first region A1 of the second conductive layer 113' presents a line width distribution with increasing line widths towards the tilted plane S. The first region A1 with varying line widths includes the first line width W1. Also, a position of the first plane P1 away from the tilted plane S has a third line width W3 along the second direction D2, and the third line width W3 is shorter than the first line width W1. The third line width W3 is also shorter than the second line width W2.

In one embodiment, a maximum line width of the first region A1 with varying line widths of the first plane P1 of the second conductive layer 113' is equal to or shorter than any line width of the tilted plane S of the second conductive layer 113'. In one embodiment, a maximum line width of the first region A1 with varying line widths is shorter than any line width of the second plane P2.

In the second embodiment, the second plane P2 of the second conductive layer 113' adjacent to the tilted plane S has a second region A2 with varying line widths. As shown in FIG. 4, the second region A2 of the second conductive layer 113' presents a line width distribution with decreasing line widths away from the tilted plane S. A position of the second plane P2 away from the tilted plane S has a fourth line width W4 along the second direction D2. The third line width W3 is shorter than the fourth line width W4, and the fourth line width W4 is shorter than the second line width W2. Also, the fourth line width W4 is longer than the first line width W1.

In one embodiment, a minimum line width of the second region A2 with varying line widths of the second plane P2 of the second conductive layer 113' is longer than any line width of the first plane P1 of the second conductive layer 113'.

Figure 5A:
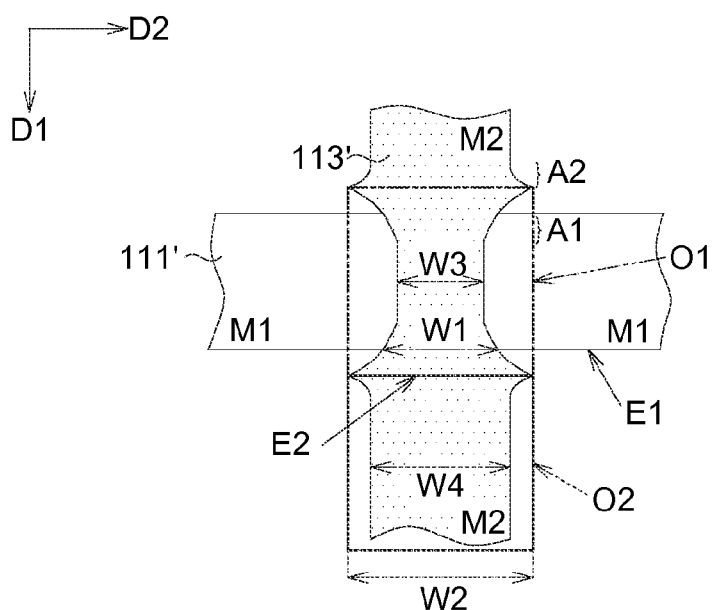
FIG. 5A is a top view of the first configuration of the conductive layers of the display panel according to the second embodiment of the present disclosure.
Figure 5B:
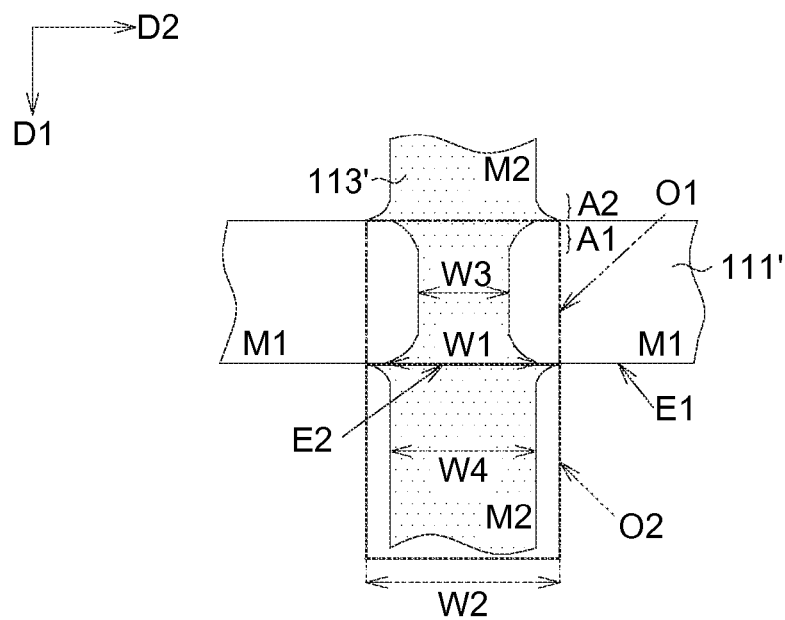
FIG. 5B is a top view of the second configuration of the conductive layers of the display panel according to the second embodiment of the present disclosure.

FIG. 5A is a top view of the first configuration of the conductive layers of the display panel according to the second embodiment of the present disclosure. FIG. 5B is a top view of the second configuration of the conductive layers of the display panel according to the second embodiment of the present disclosure. Please also refer to FIG. 1 and FIG. 4. The difference between the configurations of FIG. 5A and FIG. 5B is the slopes of the slanted surfaces of the first conductive layer 111'.

As shown in FIG. 5A, the slanted surface of the first conductive layer 111' has a gentle slope, and it is able to show the first border E1 of the first conductive layer 111' along the second direction D2 and a boundary E2 of the second conductive layer 113' in a top-view drawing, such as the schematic drawing of FIG. 3A. The boundary E2 of the second conductive layer 113', which adjoins the first portion O1 (overlapping the first conductive layer 111') and the second portion O2 (non-overlapping the first conductive layer 111') of the second conductive layer 113', is positioned outside the first border E1 of the first conductive layer 111'. The first portion O1 of the second conductive layer 113' includes the first plane P1 and the tilted plane S. As shown in FIG. 5B, the slanted surface of the first conductive layer 111' has a steep slope, the first border E1 of the first conductive layer 111' along the second direction D2 and the boundary E2 of the second conductive layer 113' almost overlap each other as the same line. Accordingly, in the case of the first conductive layer 111' sloped down sharply, the boundary E2 of the second conductive layer 113' is almost aligned with the first border E1 of the first conductive layer 111' in the top-view drawing.

Additionally, FIG. 5A and FIG. 5B also schematically show the second region A2 with varying line widths of the second plane P2 of the second conductive layer 113', the first region A1 with varying line widths of the first plane P1, and positions of the first line width W1, the second line width W2, the third line width W3 and the fourth line width W4. As shown in FIG. 5A and FIG. 5B, the third line width W3, which is shorter than the first line width W1, is positioned correspondingly at a middle of the first portion O1 of the second conductive layer 113' and extended along the second direction D2. The fourth line width W4, which is shorter than the second line width W2, is positioned correspondingly at a middle of the second portion O2 of the second conductive layer 113' and extended along the second direction D2. Scale comparisons between the first, second, third and fourth line widths W1~W4 have been described above.

Although two curving sides of the first region A1 and the second region A2 of the second conductive layer 113' are depicted for exemplifying the variation of line widths, the disclosure has no particular limitation thereto. The first region A1 and the second region A2 of the second conductive layer 113 may present a linear increasing tendency of line width variation, and those sides can be straight lines.

Third Embodiment

Figure 6:
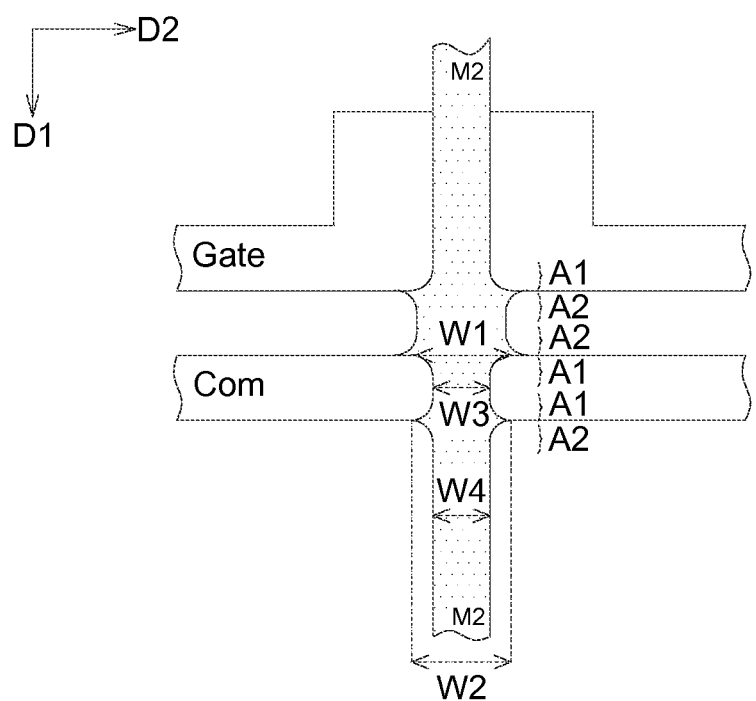
FIG. 6 illustrates a portion of the conductive layers of a display panel according to the third embodiment of the present disclosure.

FIG. 6 illustrates a portion of the conductive layers of a display panel according to the third embodiment of the present disclosure. In the third embodiment, a second conductive layer M2 across a gate line (Gate) and a common line (Com) are exemplified for illustration. However, the disclosure is not limited to the type depicted in FIG. 6. It is noted that the design of the embodiment can be modified and adjusted according to the actual needs of the practical application.

In the third embodiment, it is assumed that the slanted surfaces of the gate line (Gate) and the common line (Com) have steep slopes, and the upper border and the bottom border of each of the gate line and the common line almost overlap each other as the same line, as shown in FIG. 5B.

Also, design of line width variation of the second embodiment is adopted in the third embodiment. Accordingly, the higher positions of the second conductive layer M2 (i.e. overlapping areas between M2 and Gate/Com) comprise the first regions A1 with varying line widths, while the lower positions of the second conductive layer M2 (i.e. areas outside the overlapping areas between M2 and Gate/Com) comprise the second regions A2 with varying line widths. Moreover, the tilted plane (not shown in the top view of FIG. 6) of the second conductive layer M2 presents an arrangement of varying line widths, and the arrangement of varying line widths presents an increasing tendency of line widths correspondingly from the top towards the bottom (please refer to FIG. 4).

As shown in FIG. 6, the portions of the second conductive layer M2 overlapping the tops of the gate line (Gate) and the common line (Com) have smaller line widths, and other portions of the second conductive layer M2 non-overlapping Gate and Com have larger line widths. Also, FIG. 6 denotes the positions of the first, second, third and fourth line widths W1~W4. Scale comparisons between the first, second, third and fourth line widths W1~W4 have been provided in the aforementioned description. Also, the details of other elements have been provided in the second embodiment, which are not redundantly described herein.

According to the aforementioned descriptions, a conductive layer with varying line widths is provided that the positions of the conductive layer at different heights (such as the portions of the second conductive layer 113/113' overlapping and non-overlapping the first conductive layer 111/111' correspondingly) have different line widths; therefore, the line width of the top surface of the conductive layer is shorter than that of the bottom surface of the conductive layer. According to one embodiment as described above, the tilted plane of the conductive layer (ex: the second conductive layer 113/113') presents an arrangement of varying line widths; for example, having an increasing tendency of line widths from the top towards the bottom. According to the design of varying line widths of the embodiment, the conductive layer across other objects at different heights will have sufficient line widths after patterning procedure, and would not be over-etched and broken easily due to the accumulation of etching solution at low-lying positions. Also, the parasitic capacitance of the overlapping position between the upper and lower conductive layers can be efficiently controlled at a certain low value. The larger the overlapping area between the upper and lower conductive layers, the higher the parasitic capacitance therebetween. Accordingly, the display panel manufactured according to the embodied design possesses complete profiles of the conductive layer and sufficient line widths, thereby increasing the yield of production and improving the electrical performance of the display panel.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display panel, comprising:
a first substrate, comprising:
a conductive layer, formed over a base plate and extending along a first direction, and the conductive layer comprising a first plane correspondingly at a first height, a tilted plane, and a second plane correspondingly at a second height in a sequential order along the first direction, wherein the first height is greater than the second height; and a second substrate, disposed oppositely to the first substrate; and
a display medium layer disposed between the first substrate and the second substrate;
wherein a zone of the first plane adjacent to the tilted plane of the conductive layer has a first line width along a second direction, a zone of the tilted plane adjacent to the second plane of the conductive layer has a second line width along the second direction, and the first line width is shorter than the second line width.

2. The display panel according to claim 1, wherein another zone of the first plane away from the tilted plane has a third line width along the second direction, and the third line width is shorter than the first line width.

3. The display panel according to claim 1, wherein a zone of the second plane away from the tilted plane has a fourth line width along the second direction, and the fourth line width is shorter than the second line width.

4. The display panel according to claim 1, wherein the tilted plane of the conductive layer presents an arrangement of varying line widths, and the arrangement of varying line widths presents an increasing tendency of said line widths correspondingly from the first plane towards the second plane.

5. The display panel according to claim 1, wherein the first plane of the conductive layer adjacent to the tilted plane has a first region with varying line widths, and the first region presents a line width distribution with increasing line widths towards the tilted plane.

6. The display panel according to claim 5, wherein the first region with varying line widths includes the first line width.

7. The display panel according to claim 5, wherein a maximum line width of the first region with varying line widths is equal to or shorter than any line width of the tilted plane of the conductive layer.

8. The display panel according to claim 5, wherein a maximum line width of the first region with varying line widths is shorter than any line width of the second plane of the conductive layer.

9. The display panel according to claim 1, wherein the second plane of the conductive layer adjacent to the tilted plane has a second region with varying line widths, and the second region presents a line width distribution with decreasing line widths away from the tilted plane.

10. The display panel according to claim 9, wherein a minimum line width of the second region with varying line widths is longer than any line width of the first plane of the conductive layer.

11. A display panel, comprising:
a first substrate, comprising:
a base plate;
a first conductive layer, formed over the base plate and extending along a second direction; and
a second conductive layer, formed over the first conductive layer and extending along a first direction, and the second conductive layer comprising a first portion overlapping the first conductive layer, a second portion non-overlapping the first conductive layer, and a boundary between the first portion and the second portion;
wherein the first portion adjacent to the boundary has a first line width along the second direction, and the second portion adjacent to the boundary has a second line width along the second direction, and the first line width is shorter than the second line width, wherein a zone of the second portion of the second conductive layer away from the first portion has a fourth line width along the second direction, and the fourth line width is shorter than the second line width;

a second substrate, disposed oppositely to the first substrate; and a display medium layer disposed between the first substrate and the second substrate.

12. The display panel according to claim 11, wherein the first conductive layer along the second direction has a first border, and the boundary is correspondingly positioned apart from the first border and is not overlapped with the first conductive layer.

13. The display panel according to claim 11, wherein a zone of the first portion of the second conductive layer away from the second portion has a third line width along the second direction, and the third line width is shorter than the first line width.

14. The display panel according to claim 11, wherein the first portion of the second conductive layer, which is positioned adjacent to the boundary, has a first region with varying line widths, and the first region presents a line width distribution with increasing line widths towards the second portion of the second conductive layer.

15. The display panel according to claim 14, wherein the first region with varying line widths includes the first line width.

16. The display panel according to claim 14, wherein a maximum line width of the first region with varying line widths is shorter than any line width of the second portion of the second conductive layer.

17. The display panel according to claim 11, wherein the second portion of the second conductive layer, which is positioned adjacent to the boundary, has a second region with varying line widths, and the second region presents a line width distribution with decreasing line widths away from the boundary.

18. The display panel according to claim 17, wherein a minimum line width of the second region with varying line widths is longer than any line width of the first portion of the second conductive layer.

* * * * *